United States Patent [19]

Rotzoll et al.

[11] Patent Number: 5,625,325

[45] Date of Patent: Apr. 29, 1997

[54] SYSTEM AND METHOD FOR PHASE LOCK LOOP GAIN STABILIZATION

[75] Inventors: Robert R. Rotzoll, Allen; Jaideep Prakash, Dallas, both of Tex.

[73] Assignee: Microtune, Inc., Plano, Tex.

[21] Appl. No.: 577,780

[22] Filed: Dec. 22, 1995

[51] Int. Cl.$^6$ .............................. H03L 7/093; H03L 7/099
[52] U.S. Cl. .................... 331/16; 331/17; 331/25; 331/177 V; 331/179
[58] Field of Search .................. 331/16, 17, 25, 331/177 V, 179

[56] References Cited

U.S. PATENT DOCUMENTS

| | | | |
|---|---|---|---|
| 3,631,364 | 12/1971 | Schilb et al. | 331/36 C |
| 4,442,415 | 4/1984 | Ashida | 331/116 R |
| 4,482,871 | 11/1984 | Stingfellow | 331/101 |
| 4,510,465 | 4/1985 | Rice et al. | 331/23 |
| 4,970,472 | 11/1990 | Kennedy et al. | 331/16 |
| 4,975,662 | 12/1990 | Takeuchi | 331/111 |
| 5,144,264 | 9/1992 | Chong et al. | 331/117 R |
| 5,185,584 | 2/1993 | Takeuchi | 331/25 |
| 5,272,453 | 12/1993 | Traynor et al. | 331/57 |
| 5,339,050 | 8/1994 | Llewellyn | 331/16 |
| 5,410,571 | 4/1995 | Yonekawa et al. | 375/376 |
| 5,438,299 | 8/1995 | Shimada et al. | 331/1 A |

*Primary Examiner*—Siegfried H. Grimm
*Attorney, Agent, or Firm*—Fulbright & Jaworski L.L.P.

[57] ABSTRACT

The system and method for phase lock loop (PLL) gain stabilization uses a digital compensation technique to correct for the large amount of gain variation present in a voltage controlled oscillator (VCO) utilizing a varactor diode. AVCO is arranged with additional capacitance in parallel with the vatactor diode of the VCO. By using multiple capacitors, more or less capacitance can be switched into parallel with the vatactor diode. Gain variation is accomplished by switching capacitors into the circuit, and for each combination of capacitors used in the resonant inductance-capacitance (LC) circuit of the VCO, the gain of the phase detector in the PLL is adjusted simultaneously. The phase detector has a charge pump that drives a current into a loop filter having a capacitor with a fixed value. The gain adjustment is accomplished by varying the amount of current available from the charge pump to this filter capacitor. The gain compensation circuit that generates this charge pump current takes the same digital code used to control the capacitors in the VCO as an input and performs a digital-to-analog conversion in current mode. The analog current is then transformed into a second-order polynomial via a current squarer and programmable current scalers to provide a gain compensation signal for the phase detector. The programmable current scalers determine the coefficients of the second order polynomial. Therefore, for any given VCO characteristic with regard to the additional capacitors and the varactor diode, the coefficients of the current scalers can be adjusted to accommodate a more precise PLL gain control.

20 Claims, 3 Drawing Sheets

SYSTEM AND METHOD FOR PHASE LOCK LOOP GAIN STABILIZATION

BACKGROUND OF THE INVENTION

1. Technical Field of the Invention

This invention relates to phase lock loops (PLLs). More specifically, this invention relates to linearizing the gain of a varactor-tuned voltage controlled oscillator (VCO) with respect to its input voltage for use in optimizing a PLL.

2. Discussion of the Related Technology

All varactor-tuned VCO circuits have a non-linear transfer function characteristic in which the VCO gain changes with the DC input level. FIG. 1 shows a varactor-tuned VCO transfer function and gain definition. The transfer function 101 shows that as the input voltage increases, the VCO gain 102 increases non-linearly. This non-linearity creates difficulties when designing a PLL, because the entire PLL loop gain, bandwidth, and damping response varies with respect to the oscillator frequency. To control the overall gain of a PLL, it is necessary to compensate for the non-linearities of the varactor diode in the VCO.

Traditionally, compensation is achieved by making the varactor diode a small component of the total capacitance of the VCO using a resonant inductance-capacitance (LC) circuit connected to oscillator active circuitry. The design of a resonant LC circuit tuned VCO normally includes a varactor diode, used to adjust the effective capacitance of the tuned circuit when voltage across the diode is varied. To achieve a wide range of frequency variation requires a wide range of capacitance variation. Further, the resonant frequency of an LC resonator varies as the square root of the variation in capacitance. Thus, varactor diodes used previously have been designed with an extremely large range of capacitance variation with a respectively large variation in applied voltage, typically up to thirty volts.

Effectively, the gain of a VCO is the change in the output frequency with respect to the change in the input voltage. Thus, it is desirable to run a VCO at very low gain levels. Yet in some instances, a VCO with the capability of swinging over very wide frequency ranges will be desired. Very wide swing, however, is contradictory to low gain in a VCO. Additionally, it is desirable to have a VCO with a very large output frequency range corresponding to a large DC input voltage range. Large range variation creates a problem, however, when there are small input voltage perturbations such as noise. Referring back to FIG. 1, note that in a high voltage situation, any input noise variation will be greatly amplified by the VCO and create a large random variation of the output frequency, otherwise known as phase noise. Phase noise is a critical parameter of all VCO circuits and its control and reduction is usually a major design exercise.

One prior art technique for controlling phase noise is to limit the maximum frequency variation at the VCO output by placing a large capacitance in parallel with the varactor diode. FIG. 2 shows a prior art VCO with reduced gain via a parallel capacitor. Resonant LC circuit 20, attached to oscillator active circuitry 73, has additional capacitor 201 arranged in parallel with varactor diode 704 and inductor 706. This arrangement reduces the resonator capacitance variation, because the varactor diode 704 makes a smaller contribution to the total capacitance of the resonant LC circuit 20.

Similarly, an additional capacitor can be placed in series with a varactor diode for higher frequencies, with a similar variation effect. FIG. 3 shows a prior art VCO with reduced gain via a series capacitor. Resonant LC circuit 30 is connected to oscillator active circuitry 73 to create a VCO. Additional capacitor 301 is placed in series with varactor diode 704 in resonant LC circuit 30. Both of the prior art techniques shown in FIGS. 2 and 3 reduce the VCO gain and ultimately the circuit phase noise.

In the arrangements shown in FIGS. 2 and 3, the maximum frequency range is severely limited. In many PLL systems, however, it is still important to have a VCO that covers the high gain frequency range while maintaining the low phase noise response of the low gain frequency range. In order to remedy this situation, the technique of band-switching was implemented using either multiple VCOs or VCOs with multiple resonant networks. With multiple VCO bandswitching, several VCOs, each designed to operate in a narrow band, are switched on, one at a time.

FIG. 4 shows a prior art VCO with capacitance band-switching. Resonant LC circuit 40 contains several additional capacitors 401, 402, 403 that can be switched in via switches 411, 412, 413. For any combination of enabled switches, the VCO covers a narrow frequency range simply by varying the varactor control voltage. If it is necessary to shift the frequency substantially, one or more capacitors 401, 402, 403 can be added or removed via switches 411, 412, 413. The result is that the noise behavior of the low gain VCO is maintained. Both multiple VCOs and multiple resonant networks avoid the problem of linearizing any single network.

Another prior art technique for handling the non-linear VCO gain problem was to build a very large DC compensator network utilizing diodes and resistors to change the voltage driving the varactor diode. FIG. 5 shows a prior art VCO with control voltage compensation. FIG. 6 shows a transfer function of a prior art VCO with control voltage compensation. In FIGS. 5 and 6, a compensator DC input signal 503 is applied to a control voltage compensator 501, which outputs a compensator VCO control voltage 504 with a non-linear compensator transfer function 602. The compensator VCO control voltage 504 enters VCO 502, combines with the non-linear VCO transfer function 101 (from FIG. 1), and provides a combined VCO output 505 that has a linear transfer function 601. This scheme, however, induces excessive noise at the VCO output.

SUMMARY OF THE INVENTION

The system and method for PLL gain stabilization uses a digital compensation technique to correct for the large amount of gain variation present in a VCO having a varactor diode. The system uses a VCO with capacitance arranged in parallel with the varactor diode of the VCO. By using multiple parallel capacitors, more or less capacitance can be switched into parallel with the varactor diode. The amount of capacitance in parallel with the varactor diode defines the amount of gain at any given frequency, and it also defines the range of frequencies available at the VCO output.

Gain variation is controlled by switching capacitors into the circuit, and for each combination of capacitors used in the resonant LC circuit of the VCO, the phase detector in the PLL adjusts its gain simultaneously. A digital signal corresponds to each operational frequency range of the VCO and is supplied to both the phase detector gain circuit and the resonant LC circuit. The phase detector gain adjustment is implemented by varying the amount of current available from the charge pump in the phase detector to a fixed capacitor in the loop filter.

The gain compensation circuit that generates this charge pump current takes the same digital code used to control the capacitors in the VCO and performs a digital-to-analog (D/A) conversion in current mode. As the digital control value is adjusted, a current that is a second-order polynomial is generated at the output of the gain compensation circuit which then feeds into the phase detector. Alternatively, currents that are other order polynomials, such as first-order and third-order polynomials, could be implemented. Therefore, for any given VCO characteristic, with regard to the additional capacitors connected in parallel with the varactor diode, the coefficients of the polynomial current scalers can be adjusted to accommodate a more precise PLL gain control.

One technical advantage of the present invention is that it lowers the gain in the VCO itself, thereby decreasing noise at the VCO output. A second technical advantage is that it allows tight gain control of the entire PLL such that for any given output frequency, the PLL open-loop gain is constant. Another technical advantage is that it reduces the complexity of generating a flat gain characteristic for integrated circuit implementation. Another advantage is that a digital control word can be easily generated based on the desired operating frequency range and it does not require an analog signal, which is subject to noise.

The foregoing description broadly outlined the features and technical advantages of the present invention in order that the detailed description of the invention that follows may be better understood. Additional features and advantages of the invention, which form the subject of the claims of the invention, will be described later. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is made to the following descriptions taken in conjunction with the accompanying drawings.

DETAILED DESCRIPTION OF THE PREFERRED EMBODIMENT

Figure 1:
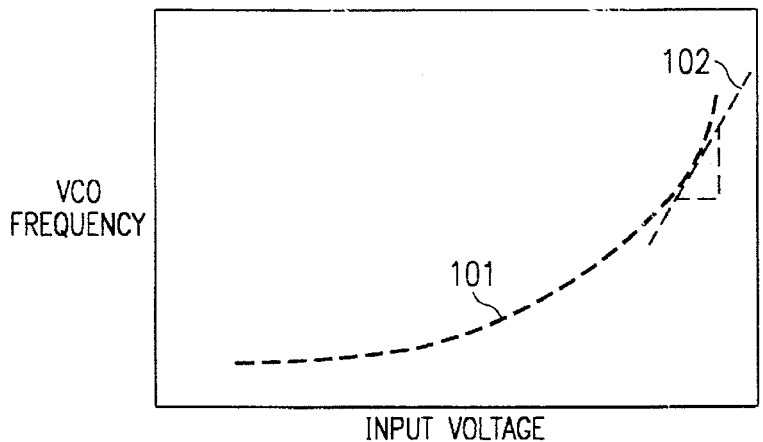
FIG. 1 shows a prior art VCO transfer function and gain definition.
Figure 2:
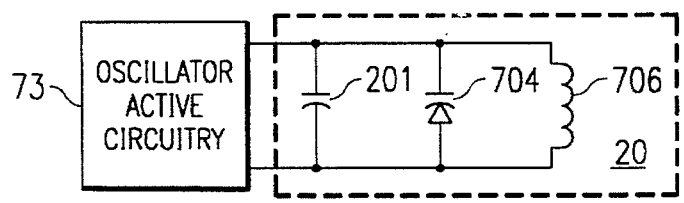
FIG. 2 shows a prior art VCO with reduced gain via a parallel capacitor.
Figure 3:
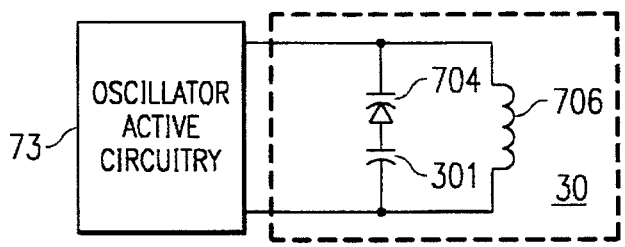
FIG. 3 shows a prior art VCO with reduced gain via a series capacitor.
Figure 4:
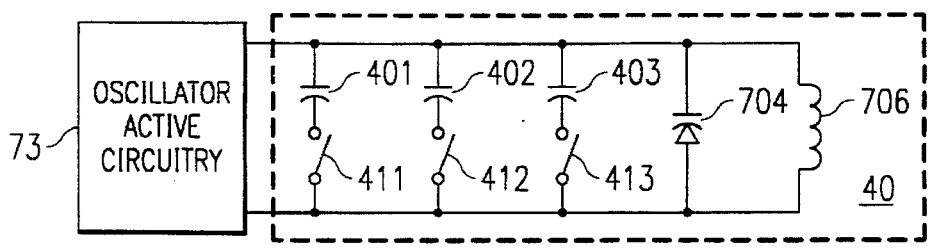
FIG. 4 shows a prior art VCO with capacitance band-switching.
Figure 5:
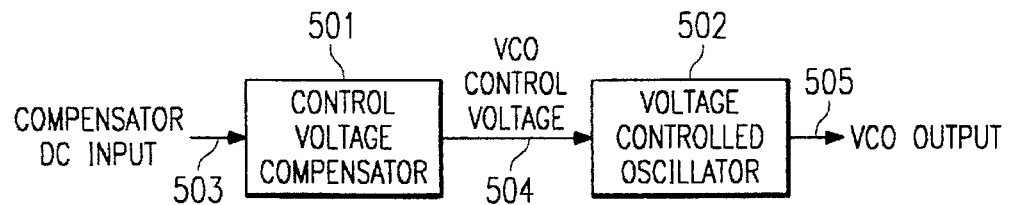
FIG. 5 shows a prior art VCO with control voltage compensation.
Figure 6:
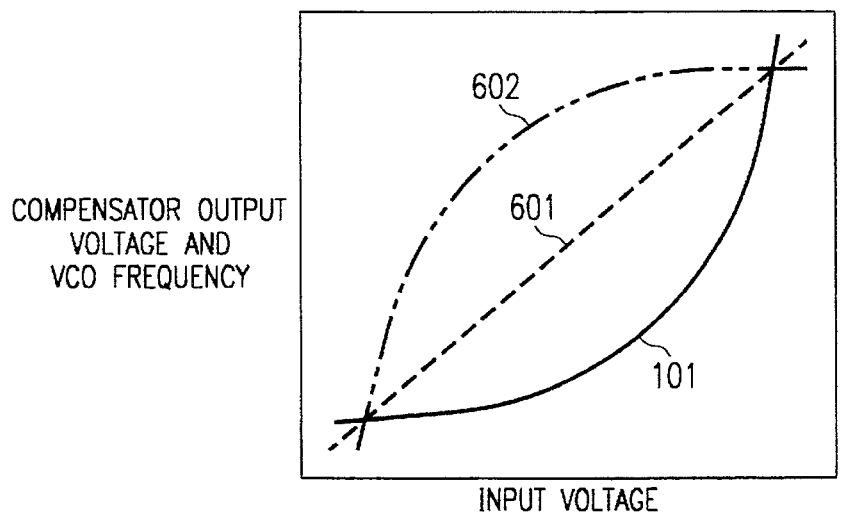
FIG. 6 shows a transfer function of a prior art VCO with control voltage compensation.
Figure 8:
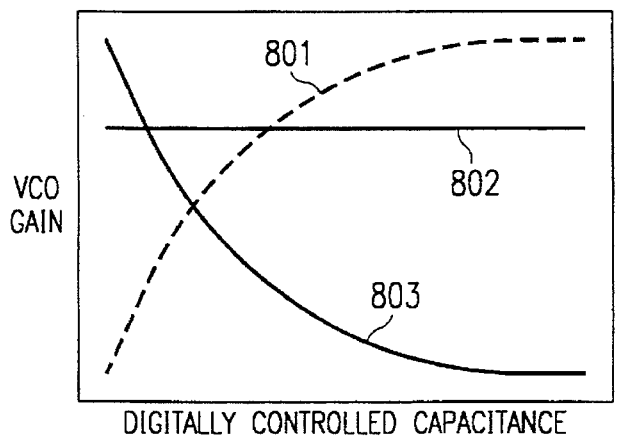
FIG. 8 shows a graph of VCO gain versus digitally controlled capacitance according to a preferred embodiment.
Figure 7:
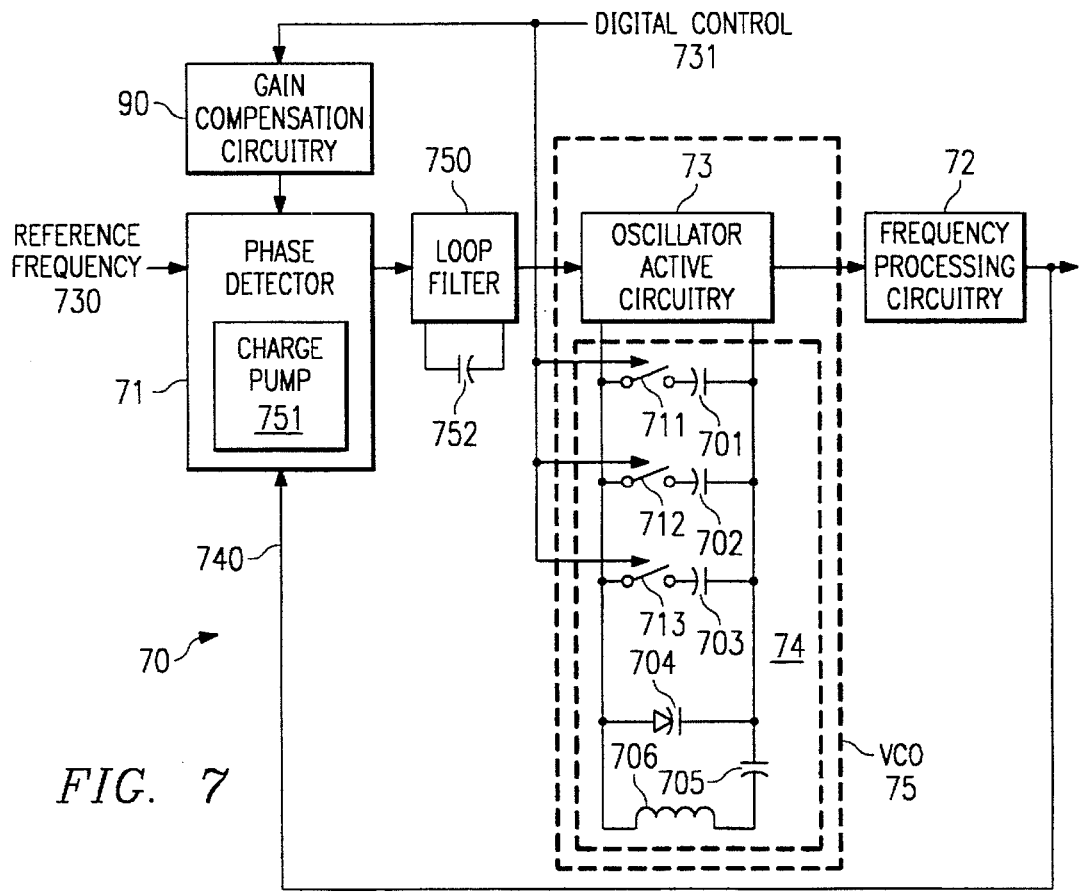
FIG. 7 shows a PLL with VCO gain compensation according to a preferred embodiment.

The preferred embodiment solves the problem of maintaining a relatively constant PLL gain in the presence of a low, but highly variable, VCO gain. FIG. 7 shows a PLL with VCO gain compensation according to a preferred embodiment. This embodiment has a limited VCO frequency range, because a single varactor diode is used in the resonant circuit. The narrow frequency range of a single diode improves gain linearity, because the gain varies little with frequency. FIG. 8 shows a graph of VCO gain versus digitally controlled capacitance according to a preferred embodiment. Note that the basic VCO gain 803 is reduced for large digitally controlled capacitance and increased for small digitally controlled capacitance. This non-linearity is solved in the preferred embodiment by using a gain compensation current generator to create a compensator gain 801 to correct the phase detector gain so that the overall PLL gain 802 remains approximately constant for all variations in digitally controlled capacitance.

Returning to FIG. 7, PLL 70 has phase detector 71 with charge pump 751 that essentially compares a sinusoidal signal emanating from VCO 75 via feedback loop 740 to reference frequency signal 730. The output of phase detector 71, representing the difference between the reference and feedback signal frequencies, adjusts the VCO 75 so that the VCO output frequency tends to match reference frequency 730. Note that frequency processing circuit 72 may alter the output signal from VCO 75 before the signal feeds back to phase detector 71, and loop filter 750 with fixed capacitance 752 at the output of the phase detector 71 reduces the amount of noise and AC variation entering the oscillator 73.

VCO 75 includes oscillator active circuitry 73 and resonant LC circuit 74. The loop filter output voltage drives varactor diode 704 in resonant LC circuit 74. Coupling capacitor 705 blocks DC voltage across the varactor diode 704 and prevents it from being shorted by inductor 706. Digital control signal 731 drives both gain compensation circuitry 90 (see FIG. 9) and switches 711, 712, 713 in resonant LC circuit.74. The output of VCO 75 varies in frequency according to which switches 711, 712, 713 have been closed and the voltage applied to varactor diode 704. Digital control signal 731 represents a selected VCO frequency band.

The gain compensation circuitry 90 output, controlled by digital control signal 731, feeds into phase detector 71 and is used to vary the gain of the phase detector. The gain compensation circuitry output is preferably a current signal, and the phase detector gain is preferably defined by a fixed capacitor 752 in the loop filter 750 multiplied by the current that comes from gain compensation circuitry 90. The digital control signal 731 is simultaneously fed to gain compensation circuitry 90 as well as resonant LC circuit 74 of the VCO. Thus, the gain of the phase detector 71 set by gain compensation circuitry 90 and the gain of the VCO 75 are modified continuously, and the two counteract each other.

Via feedback, PLL 70 adjusts the output frequency of VCO 75 until it precisely matches reference frequency 730. When reference frequency 730 and the output of VCO 75 are equal, or at a frequency relationship defined by frequency processing circuitry 72, voltage variation to varactor diode 704 stops and a constant voltage level is maintained, which creates a constant VCO output frequency. Note that digital control signal 731 must also be at a constant setting in order to maintain a constant VCO output frequency.

Figure 9:
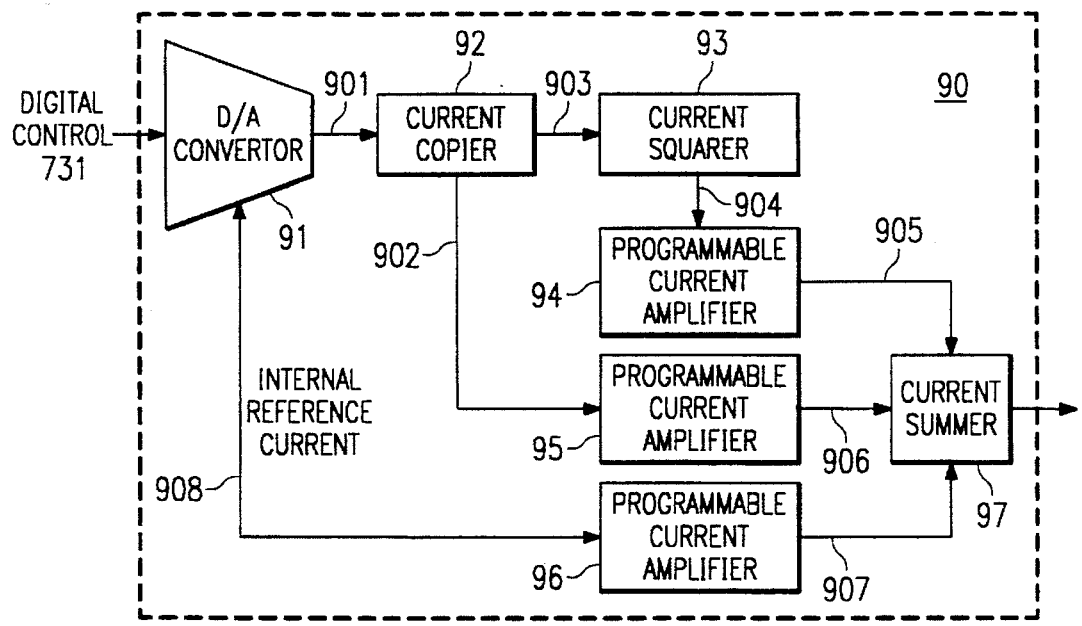
FIG. 9 shows details of a VCO gain compensation circuit according to a preferred embodiment.

FIG. 9 shows details of VCO gain compensation circuitry 90 according to a preferred embodiment. The gain compensation circuitry 90 includes a D/A convertor 91, an analog polynomial term generator 92–96, and a summer 97. The gain compensation circuitry 90 adjusts the phase detector gain of the PLL based on the selected VCO frequency band represented by digital control signal 731 also shown in FIG. 7. The D/A converter 91 first converts the digital band selection control signal 731 to an equivalent analog current 901 using an internal reference current 908. This analog current is the basis for a second-order polynomial that will control the gain of the phase comparator in the PLL.

In order to create the second-order polynomial, analog current 901 is replicated in a current copier 92 or current mirror with two outputs 902, 903 that are equal in value to the D/A convertor output 901. One current copier output 903 is fed into a current squarer 93 that generates an output current 904 equal to the square of the input current 903. This output current 904 is then scaled by a programmable current amplifier 94. A second current mirror output 902 is fed into a separate programmable current amplifier 95. Finally, another programmable current amplifier 96 takes the reference current 908 and scales it to create output 907. The outputs of the three programmable current amplifiers 905, 906, 907 are summed by current summer 97.

The output of summer 97, which is the output of gain compensation circuitry 90, is a current relating as a second-order polynomial of the digital input bank selection value represented by digital control signal 731, with the polynomial coefficients adjustable via programmable current amplifiers 94, 95, 96. The resulting signal becomes the reference charge current used in charge pump 751 of phase detector 71 in the PLL (shown in FIG. 7). The phase detector gain is proportionally adjusted by the reference current in the charge pump. By determining the value of VCO gain for each selected frequency band, a polynomial in the gain compensation circuitry 90 can be generated that compensates for the gain variation within the selected frequency band. Therefore, the PLL open-loop gain will remain constant with respect to each digital frequency bank selection.

Although the present invention and its advantages have been described in detail, it should be understood that various changes, substitutions, and alterations can be made without departing from the spirit and scope of the invention as defined by the appended claims.

We claim:

1. A phase lock loop gain stabilizer circuit comprising:
   (A) a gain compensator;
   (B) a phase detector connected to an output of the gain compensator having a reference frequency input, a charge pump, and a voltage controlled oscillator feedback input;
   (C) a loop filter connected to an output of the phase detector having a fixed capacitor; and
   (D) a voltage controlled oscillator connected to an output of the loop filter comprising:
      (1) oscillator active circuitry; and
      (2) a bandswitched inductance-capacitance circuit connected to the oscillator active circuitry having a varactor diode, a first capacitor connected in parallel with the varactor diode, and a first switch connected in series with the first capacitor, wherein a digital control signal is connected to both an input of the gain compensator and the first switch for simultaneously adjusting a gain of the phase detector and a gain of the voltage controlled oscillator.

2. A phase lock loop gain stabilizer circuit according to claim 1, wherein the bandswitched inductance-capacitance circuit further comprises:

a second capacitor and an inductor connected in parallel with the varactor diode.

3. A phase lock loop gain stabilizer circuit according to claim 1, wherein the bandswitched inductance-capacitance circuit further comprises:

a third capacitor connected in parallel with the varactor diode, and a second switch connected in series with the third capacitor, wherein the digital control signal is also connected to the second switch.

4. A phase lock loop gain stabilizer circuit according to claim 3, wherein the bandswitched inductance-capacitance circuit further comprises:

a fourth capacitor connected in parallel with the varactor diode, and a third switch connected in series with the fourth capacitor, wherein the digital control signal is also connected to the third switch.

5. A phase lock loop gain stabilizer circuit according to claim 1, wherein the gain compensator comprises:

a circuit for creating a current relating as a polynomial to the digital control signal.

6. A phase lock loop gain stabilizer circuit according to claim 1, wherein the gain compensator comprises:

a circuit for creating a current relating as a second-order polynomial to the digital control signal.

7. A phase lock loop gain stabilizer circuit according to claim 6, wherein the gain compensator comprises:

a digital-to-analog convertor for converting the digital control signal to an analog current connected to a reference current;

a current copier connected to an output of the digital-to-analog convertor;

a current squarer connected to a first output of the current copier;

a first current scaler connected to an output of the current squarer;

a second current scaler connected to a second output of the current copier;

a third current scaler connected to the reference current;

a current summer connected to an output of the first current scaler, an output of the second current scaler, and an output of the third current scaler.

8. A phase lock loop gain stabilizer circuit according to claim 7, wherein the first current scaler is programmable.

9. A phase lock loop gain stabilizer circuit according to claim 7, wherein the second current scaler is programmable.

10. A phase lock loop gain stabilizer circuit according to claim 7, wherein the third current scaler is programmable.

11. A method for stabilizing the gain of a phase lock loop comprising the steps of:

creating a digital control signal representing a selected oscillator frequency band;

feeding the digital control signal to a gain compensator to alter a gain of a phase detector in a phase lock loop; and controlling a resonant inductance-capacitance circuit using the digital control signal to alter a gain of a voltage controlled oscillator in the phase lock loop.

12. A method for stabilizing the gain of a phase lock loop according to claim 11, wherein the step of feeding comprises:

converting the digital control signal to an analog control signal;

creating a current relating as a polynomial to the analog control signal.

13. A method for stabilizing the gain of a phase lock loop according to claim 12, wherein the polynomial is a second-degree polynomial.

14. A method for stabilizing the gain of a phase lock loop according to claim 12, wherein the step of creating comprises:

squaring the analog control signal; and scaling the squared analog control signal.

15. A method for stabilizing the gain of a phase lock loop according to claim 12, wherein the step of creating comprises:

scaling the analog control signal.

16. A circuit for stabilizing the gain of a phase lock loop comprising:

means for creating a digital control signal representing a selected oscillator frequency band;

means for feeding the digital control signal to a gain compensator to alter a gain of a phase detector in a phase lock loop; and means for controlling a resonant inductance-capacitance circuit with the digital control signal to alter a gain of a voltage controlled oscillator in the phase lock loop.

17. A circuit for stabilizing the gain of a phase lock loop according to claim 16, wherein the means for feeding comprises:

means for converting the digital control signal to an analog control signal; and means for creating a current relating as a polynomial to the analog control signal.

18. A circuit for stabilizing the gain of a phase lock loop according to claim 17, wherein the polynomial is a second-degree polynomial.

19. A circuit for stabilizing the gain of a phase lock loop according to claim 17, wherein the means for creating comprises:

means for squaring the analog control signal; and means for scaling the squared analog control signal.

20. A circuit for stabilizing the gain of a phase lock loop according to claim 17, wherein the means for creating comprises:

means for scaling the analog control signal.

* * * * *